United States Patent [19]

Havens

[11] 4,309,672
[45] Jan. 5, 1982

[54] NEGATIVE RESISTANCE OSCILLATOR/AMPLIFIER ACCUMULATOR CIRCUIT

[75] Inventor: Richard C. Havens, Scottsdale, Ariz.

[73] Assignee: Ad-Tech Microwave, Inc., Scottsdale, Ariz.

[21] Appl. No.: 120,376

[22] Filed: Feb. 11, 1980

[51] Int. Cl.³ .............................................. H03B 7/14
[52] U.S. Cl. ...................................... 331/96; 330/56; 331/107 DP; 331/107 P; 331/107 C
[58] Field of Search .......... 331/96, 101, 102, 107 DP, 331/107 P, 107 C, 117 D, 56; 330/56

[56] References Cited

U.S. PATENT DOCUMENTS 3,534,293 10/1970 Harkless ......................... 331/107 C
3,628,171 12/1971 Kurokawa et al. ............... 331/96 X

OTHER PUBLICATIONS

Kurokawa, "The Single-Cavity Multiple-Device Oscillator", IEEE Transactions on Microwave Theory and Techniques, vol. MTT-19, Oct., 1971 pp. 793-801.

*Primary Examiner*—Siegfried H. Grimm
*Attorney, Agent, or Firm*—James F. Duffy

[57] ABSTRACT

A microwave oscillator/amplifier includes a plurality of TEM transmission lines each with a negative resistance device at one end and a lossy, matched termination at the other end. A resonant cavity is coupled to each TEM line so as to induce a parallel resonance on the lines at the region of coupling. Structural means are provided for maintaining the characteristic impedance of the TEM lines uniform along the length of said lines. Fabrication of a device in which the TEM line characteristic impedance was uniformly maintained along the line length at five times the optimum negative resistance of said negative resistance device is noted. Suggested levels of characteristic impedance are relatively low compared to prior art devices, none of which are known to attempt maintenance of characteristic impedance uniform along the length of the TEM transmission line. No impedance transformers are employed between the negative resistance device thus permitting the device to be located at the closest point to the resonant cavity at which the impedances presented by the cavity and the negative resistance device are equal in magnitude and opposite in sign. An efficient oscillator with practically no moding, spurious oscillations, or starting problems results.

8 Claims, 2 Drawing Figures

NEGATIVE RESISTANCE OSCILLATOR/AMPLIFIER ACCUMULATOR CIRCUIT

BACKGROUND OF THE INVENTION

1. Field of the Invention

This invention relates to oscillator/amplifier circuits, and more particularly to microwave oscillator/amplifier circuits using at least one negative resistance device.

2. Prior Art

A negative resistance oscillator basically comprises a negative resistance device connected through a resonator, tuned to the desired frequency, to a load. The impedance presented by the cavity and load to the device is the negative of the negative resistance device. Typical examples of negative resistance devices used for generating microwave oscillations are the bipolar transistor, the field effect transistor, IMPATT diode, TRAPATT diode, Gunn diode, tunnel diode, LSA diode, etc. As is well known in the art, many negative resistance oscillators can be loaded to the point where oscillations will cease, where it will then produce reflection gain. With this overcoupled oscillator/amplifier is then used with some device to separate the incident power from the reflected power, such as a ferrite circulator, it can be used as an amplifier. In that sense, this invention pertains to both amplifiers and oscillators. However, for purposes of discussion, the invention is described in the oscillation mode. This is not meant to detract in any way from the invention's usefulness as an amplifier.

Prior art microwave negative resistance oscillators and accumulators (especially IMPATT oscillators) have been plagued by "molding" or oscillations under various different operating conditions, such as over normal environmental temperature ranges or a mechanical frequency tuning bandwidth, at frequencies other than the desired oscillation frequency. Numerous patents, such as U.S. Pat. Nos. 3,534,293; 3,628,171; 3,931,587; 3,984,788; 4,016,507; 4,034,314; and 4,075,573, have been directly or indirectly concerned with the problem. Prior art microwave IMPATT oscillators have also exhibited starting problems at low duty factor and/or cold temperatures. Also, prior art microwave IMPATT oscillators and especially IMPATT microwave power accumulators have exhibited a tendency to have very narrow mechanical frequency tuning ranges. Power drop off or moding tended to be severe for just small changes in the operating frequency or temperature. Hence, there is a need for better solutions to these problems.

SUMMARY OF THE INVENTION

Accordingly, it is an object of the present invention to provide a new and improved negative resistance microwave oscillator.

It is another objective of the present invention to provide a negative resistance oscillator wherein power from a plurality of negative resistance devices is combined and easily removed from a single resonant cavity or circuit.

It is a further objective of the present invention to provide a negative resistance oscillator having freedom from "moding," spurious oscillations, and frequency jumping, that is, any abrupt change of oscillation frequency or additional oscillation frequency due to a change in mechanical frequency tuning adjustment or environmental changes, such as temperature.

A still further objective of the present invention is to provide a negative resistance oscillator with out of band RF loading to prevent undesired oscillations.

An additional objective of the present invention is to provide a negative resistance oscillator having mechanical frequency tuning with freedom from moding and spurious oscillations.

A still additional objective of the present invention is to provide a negative resistance oscillator having freedom from "starting problems," that is, that prevents delay in the start up of oscillation between the applied bias current or voltage and the build up of oscillations.

It is a further objective of the present invention to provide a negative resistance oscillator which is compact, and lightweight and does not require quarter wavelength transformers as required by most previous art.

These and other objectives of this invention will become apparent to those skilled in the art upon consideration of the accompanying specifications, claims, and drawings.

In accordance with the foregoing and other objects, there is provided a negative resistance microwave oscillator having a negative resistance device, including at least one two conductor TEM transmission line having a characteristic impedance relatively uniform along its entire length, said characteristic impedance being relatively low, approaching that of the negative resistance of the negative resistance device, the negative resistance device being at one end of the transmission line and a matched RF load impedance at the other end thereof; a resonant cavity or circuit, resonant at the desired operating frequency, which couples RF energy to a useful RF load and also couples energy between the resonant cavity and each two conductor transmission line at a point or points in between the negative resistance device and the matched RF load.

A feature of the present invention is that the resonant cavity induces a parallel resonance onto the two conductor transmission line in between the negative resistance device and the matched RF load whereupon this impedance is transformed by approximately a quarter wavelength of uniform characteristic impedance, two conductor transmission line into the negative impedance of the negative resistance device so as to provide series resonance at the interface of the negative resistance device and the uniform characteristic impedance two conductor transmission line. Pulsed IMPATT oscillators at 9 to 10 GHz. have been built according to this invention which exhibit exceptional freedom from moding, spurious oscillations, and starting problems under all normal operating conditions.

BRIEF DESCRIPTION OF THE DRAWINGS

Referring to the drawings, wherein like characters indicate like parts throughout the Figures.

DESCRIPTION OF THE PREFERRED EMBODIMENT

Figure 1:
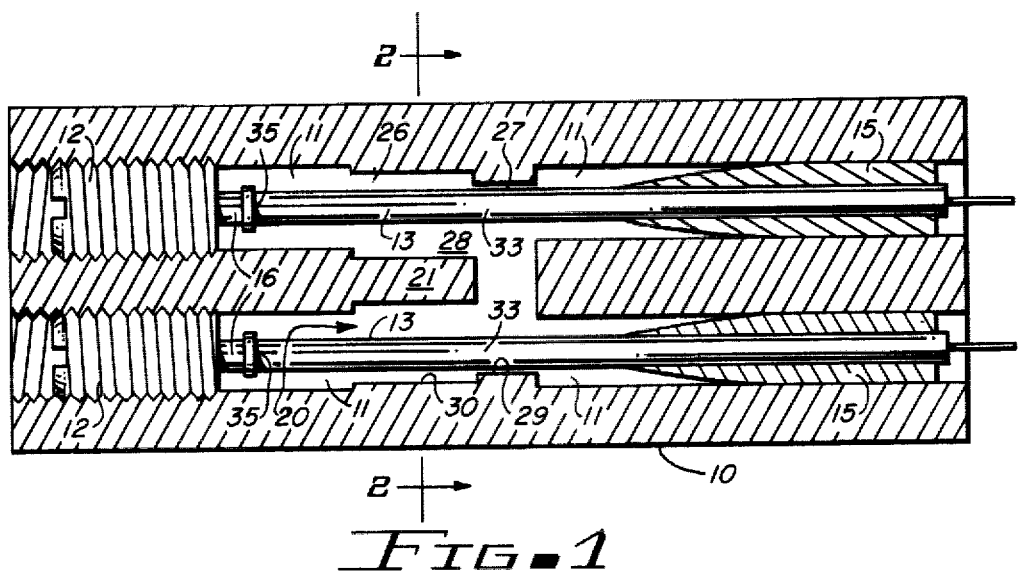
FIG. 1 is a view in cross section of a solid state microwave oscillator of the preferred embodiment of the invention.
Figure 2:
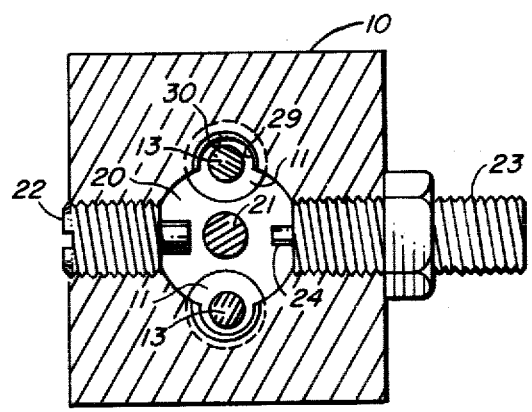
FIG. 2 is a cross sectional view as seen from line 2—2 in FIG. 1.

Referring to FIGS. 1 and 2, the numeral 10 generally designates a single housing defining a plurality of first elongated openings or cavities 11 which extend from one end of the housing 10 to the other for each of the plurality of diodes 16 to be used in the oscillator. The number of diodes 16 to be used may vary from one to as many as can be physically fit into the structure as defined herein. Plugs 12 are threadedly engaged in the housing 10 in one end of the opening 11 to seal the one end of opening 11. In the preferred embodiment, the opening 11 has a generally circular cross section so that the elongated center conductors 13 which also have a circular cross section form two conductor transmission lines (in this case a coaxial transmission line). However, it should be understood that any transverse electromagnetic (TEM) or two conductor transmission line, i.e., microstrip, stripline, coaxial transmission line, etc., might be utilized.

A lossy load material 15 is affixed to center conductors 13 so to form an RF load which is matched to the characteristic impedance of the two conductor transmission line formed by center conductor 13 and the housing 10, including center post 21.

The two conductor transmission line, of which rod 13 is the center conductor, is designed so that the characteristic impedance of the line is the same or "uniform" over the entire physical length of center conductor 13. This is a simple matter to achieve in a coaxial structure of uniform dimensions, as in a conventional coaxial transmission line. However, in the preferred embodiment, the characteristic impedance formed with the center conductor 13 as it passes through resonant cavity 20 is influenced by the center post 21 and the specific geometry of cavity 20 regions 26 and 27. Thus the equivalent circuit of the TEM line as it passes through cavity 20 must be considered if the resultant characteristic impendance of the TEM line is to be maintained uniform along the length of center conductor 13. Modern filter theory, well known even-and-odd mode concepts, or empirical methods, can be used by those skilled in the art to assure that the resultant two conductor TEM transmission line characteristic impedance in the regions of cavity 20 is such as to maintain the overall characteristic impedance of the TEM line uniform along its length. Thus, in cavity 20, analysis of the equivalent circuit leads to construction of an actual TEM transmission line in regions 26 and 27, in which conductor 13 is the "center" conductor, having an equivalent and desired characteristic impedance so that the impedance along the length of conductor 13 through cavity 20 remains uniform despite non-uniformity in line geometry.

The two conductor transmission line characteristic impedance should be roughly three to eight times the optimum negative resistance of the operating negative resistance device. In the preferred embodiment shown, the ratio actually used was five times. Lowering this characteristic impedance below the range given will increase loss in loads 15, reduce power output, reduce efficiency, and improve starting conditions. Raising this characteristic impedance above that of the range given will also increase loss in cavity 20, reduce power output, and reduce efficiency, but will make starting problems more severe.

Negative resistance devices 16 are electrically and mechanically connected to the other end of center conductors 13. The conductor 13 is positioned concentrically within the opening 11 by the negative resistance device 16 which is electrically and mechanically connected to the plug 12. RF load material 15 is affixed to the other end of conductor 13 thus maintaining the opposite end of the center conductor 13 in the proper concentric position. The end of the elongated center conductor 13 having the RF load material 15 affixed thereto is accessible from the outside of the housing 10 so that a D.C. bias voltage may be applied thereto to energize the oscillator. It should be understood that the negative resistance device 16 may be any type negative resistance device, such as a transistor, a Gunn diode, an IMPATT diode, etc., or any other type device that can provide a negative resistance at RF frequencies.

A second cavity 20 is defined in the housing 10. Cavity 20, along with the center post 21 and housing 10, form what is called a reentrant cavity. This type of cavity is commonly known to those skilled in the art as a reentrant cavity, but is sometimes referred to as a "coaxial cavity," however, strictly speaking, it is not a coaxial cavity or TEM cavity, since all the fields are not transverse throughout the cavity. The conductors 13 pass through the cavity 20 and are thus coupled to it. However, it should be pointed out that any type of coupling between the cavity 20 and the center conductors 13 does not depart from the spirit of the invention. Also, while the cavity 20 of the preferred embodiment is shown to be reentrant, any other type of dominant or non-dominant cavity, such as a cylindrical waveguide cavity, or rectangular waveguide cavity, does not depart from the spirit of the invention.

The reentrant cavity is resonant at or near the desired frequency of oscillation of the oscillator. A threaded opening is formed through the housing 10 into cavity 20 and a tuning screw 22 is threadedly engaged therein, which tuning screw has a sapphire rod extending from the inner end thereof into cavity 20 for frequency tuning the resonator. This tuner could be of any other type, i.e., metal, etc., and be in any other location in the resonant cavity. All that is necessary is that a mechanically adjustable metal or dielectric element perturb the electromagnetic fields in the cavity so as to change the resonant frequency.

A second opening is formed through the housing 10 into the cavity 20, and a coaxial RF power output connector 23 is threadedly engaged therein. An RF probe 24 penetrates into cavity 20 and couples RF power out through output connector 23. The probe 24 is an extension of the center conductor of output connector 23. However, it should be understood that this RF output coupling could be any of the well-known types, i.e., an iris, a loop, etc. In addition, the output coupling location could be at any point appropriate to the type of coupling selected without deviating from the spirit of this invention. Another specific embodiment of the invention has been built and tested wherein the probe enters the reentrant cavity opposite the center post 21 on the center axis of the cavity 20. This configuration is also within the spirit of the invention.

According to the invention, it is desired to maintain the characteristic impedance of the transmission lines formed with the center conductors 13 uniform over their entire length. This is accomplished by adjusting the spacings 26 and 27 of scalloped half holes 29 and 30 so that the same uniform characteristic impedance is maintained over the full length of the two conductor transmission line formed with center conductor 13. In the area next to center post 21, the spacing 28 must be accounted for in the gap 26 so as to obtain the correct characteristic impedance of the two conductor transmission line. The preferred embodiment shown shows only one method of maintaining the same equivalent transmission line characteristic impedance. However, any method of accomplishing the same result is considered to be within the spirit of this invention. Methods of determining what the gaps should be so as to maintain the same characteristic impedance are well known to those skilled in the art and are a part of modern filter theory involving even and odd mode impedances.

Because of the resonant cavity or circuit formed by cavity 20, post 21, and housing 10, a parallel resonance is induced upon the two conductor transmission line composed of conductor 13 and cavity 20. In the preferred embodiment, this parallel resonance occurs along each conductor 13 at the location indicated by reference numeral 33. The location of this parallel resonance can be measured by techniques commonly known to those skilled in the art. The electrical length of transmission line between position 33 and position 35, which is at the electrical interface between conductor 13 and negative resistance device 16, is approximately one-quarter wavelength in accordance with the intent of this invention. Therefore, the impedance of the operating circuit at position 35 exhibits series resonance between the negative resistance device and the impedance measured looking out from the negative resistance device towards the parallel resonance, at the operating frequency. The negative resistance of the negative resistance device is then equal in magnitude to the positive resistance of the aforementioned impedance measured looking outward from the device. In other words, the circuit impedance is the negative of the impedance of the negative resistance device.

The amount of coupling between the resonant cavity formed by housing 10, center post 21, and cavity 20 and the two conductor transmission line formed by housing 10 and conductor 13 is determined by the spacing 28 between the conductor 13 and the center post 21 or the center axis of the cavity 20. Increasing the spacing 28 will increase the Q of the oscillator, while decreasing the spacing 28 will lower the Q. The output probe 24 is simply adjusted for maximum power output or to provide the desired load resistance at position 35 to match the optimum negative resistance of the negative resistance device. While one method of adjusting this coupling is shown in the present embodiment, any other method of adjusting this coupling, whether with the same or different type of resonant cavity, to the desired value is considered to be within the scope of this invention.

Thus, a negative resistance oscillator is disclosed utilizing one or more two conductor transmission lines, each terminated with a negative resistance device at one end and a matched RF load at the other end with a resonant cavity coupled thereto. The resonant cavity couples an impedance to the two conductor transmission line which is then transformed in a specific manner to provide the negative impedance of the negative resistance device. Thus, what has been disclosed is an oscillator which, in the preferred embodiment, has novel features including a quarter wave spacing between the induced parallel resonance and the negative resistance device, a uniform characteristic impedance of the two conductor transmission line, matched terminations, a low two conductor transmission line characteristic impedance, and the absence of quarter wave transformers as taught in the prior art the use of which, by definition, produces a non-uniform characteristic impedance line. This oscillator is made to work well with IMPATT diodes and other negative resistance devices. An oscillator built to the specifications given here has shown high efficiency, freedom from frequency moding and spurious oscillations, freedom from cold starting problems, and wide mechanical tuning range.

While I have shown and described a specific embodiment of this invention, further modifications and improvements will occur to those skilled in the art. It is to be understood, therefore, that this invention is not limited to the particular form shown but is defined by the appended claims wherein.

I claim:

1. In a cavity oscillator/amplifier comprised of a resonant cavity coupled to at least one TEM transmission line, said line having a negative resistance device coupled at one end as a source of r.f. energy and a dissipative load element at an opposite end, the improvement comprising:

means for maintaining a uniform characteristic impedance along the length of said TEM transmission line.

2. The improved cavity oscillator/amplifier of claim 1 wherein said means for maintaining a uniform characteristic impedance along the length of said TEM transmission line comprises structural means for affecting the geometry of said TEM line as said TEM line enters into, passes through and exits from the region of coupling of said resonant cavity to said TEM line.

3. The improved cavity oscillator/amplifier of claim 2 wherein said TEM line is comprised of structural means having geometries for maintaining said uniform characteristic impedance at a selected impedance level relatively low in comparison to prior art devices, more closely approaching that of the optimum negative resistance of said negative resistance device.

4. The improved cavity oscillator/amplifier of claim 3 wherein said structural means have geometries for maintaining said uniform characteristic impedance at a selected impedance level in the range of three to eight times the optimum negative resistance of said negative resistance device.

5. The improved cavity oscillator/amplifier of claim 4 further comprising means for directly coupling said negative resistance device to said TEM transmission line without the introduction of transformation devices of differing characteristic impedance.

6. The improved cavity oscillator/amplifier of claim 5 further comprising means for locating said negative resistance device at the closest point to said resonant cavity at which the impedances presented by said cavity and said negative resistance device are equal in magnitude and opposite in sign.

7. The improved cavity oscillator/amplifier of claim 5 further comprising means for locating said negative resistance device one-quarter wave length from said resonant cavity.

8. The improved cavity oscillator/amplifier of claim 2 wherein said structural means comprise means for varying the geometry of the wall of said resonant cavity and the spacing between said transmission line and the wall of said resonant cavity, said geometry of said wall including a scalloped geometry.

* * * * *